United States Patent [19]
Mattos

[11] Patent Number: 5,233,238
[45] Date of Patent: Aug. 3, 1993

[54] HIGH POWER BUFFER WITH INCREASED CURRENT STABILITY

[75] Inventor: Derwin W. Mattos, San Jose, Calif.

[73] Assignee: VLSI Technology, Inc., San Jose, Calif.

[21] Appl. No.: 812,194

[22] Filed: Dec. 20, 1991

[51] Int. Cl.⁵ .................... H03K 17/16; H03K 5/12
[52] U.S. Cl. .................... 307/443; 307/451; 307/263
[58] Field of Search ............ 307/443, 263, 448, 542, 307/572, 270, 451

[56] References Cited

U.S. PATENT DOCUMENTS

| | | | |
|---|---|---|---|
| 4,800,298 | 1/1989 | Yu et al. | 307/443 |
| 4,825,099 | 4/1989 | Barton | 307/270 |
| 4,825,101 | 4/1989 | Walters, Jr. | 307/270 |
| 4,825,102 | 4/1989 | Iwasawa et al. | 307/296 |
| 4,827,159 | 5/1989 | Naganuma | 307/443 |
| 4,857,863 | 8/1989 | Ganger et al. | 307/263 |
| 5,120,992 | 6/1992 | Miller | 307/443 |
| 5,121,013 | 6/1992 | Chuang et al. | 307/443 |
| 5,138,194 | 8/1992 | Yoeli | 307/443 |

Primary Examiner—Edward P. Westin
Assistant Examiner—Andrew Sanders
Attorney, Agent, or Firm—Douglas L. Weller

[57] ABSTRACT

A circuit buffers output in an integrated circuit. The circuit includes a circuit input, a circuit output, a power signal, a ground signal, a first transistor, a second transistor, a third transistor, a fourth transistor, variable resistance means, and control means. The variable resistance means is connected between the source of the first transistor and the drain of the second transistor. The variable resistance provides one of a first impedance and a second impedance between the source of the first transistor and drain of the second transistor in response to a control signal. The control means is connected to the control input means of the variable resistance means. After a voltage level transition on the circuit input and during a resulting voltage level transition on the circuit output, in response to the control means, the variable resistance means first provides the first impedance and then provides the second impedance between the source of the first transistor and drain of the second transistor.

15 Claims, 5 Drawing Sheets

HIGH POWER BUFFER WITH INCREASED CURRENT STABILITY

BACKGROUND

The present invention concerns a high power buffer with increased current stability which is used to buffer output for an integrated circuit.

An output buffer stage for an integrated circuit needs to source and sink current into a large capacitive load in order to change voltage at an output pad of the integrated circuit.

In complementary metal oxide semiconductor (CMOS) devices, output voltage on an output pad is pulled up by electrically connecting the output pad through a first transistor to a power voltage ($V_{dd}$). Output voltage on the output pad is pulled down by electrically connecting the output pad through a second transistor to a source (or ground) voltage ($V_{ss}$).

In order to change the output voltage on an output pad, a relatively large amount of current is required to charge or discharge the capacitive load. For example, when the voltage transition on the output pad is from low to high, the output buffer stage acts as a current source to provide current to charge the capacitive load. When the voltage transition on the output pad is from high to low, the output buffer stage acts a current sink to discharge the capacitive load.

The large increase of current flow during a voltage transition time effects the power voltage ($V_{dd}$) and/or the source voltage ($V_{ss}$) because of inductances within the power and ground lines. The result can be a voltage spike in the power voltage during a low to high voltage transition, and a voltage spike in the source voltage during a high to low voltage transition.

When the ground line and power line for an output buffer stage are shared by other circuits within an integrated circuit, or even other output buffer stages, the voltage spikes caused by transitions can cause erroneous data transitions or reduce performance levels. Several types of circuits have been used in the prior art to lessen the severity of voltage variations in the power voltage and source voltage due to transitions on an output.

For example, for an output stage where a first transistor is connected between an output pad and the power voltage, and where a second transistor is connected between the output pad and the source voltage, circuitry may be added to each output buffer stage which assure that both the first transistor and the second transistor will not be simultaneously turned on during a transition. Such circuitry eliminates "crowbar" current which can flow directly from the power voltage to the source voltage during a transition. The circuitry may be implemented, for example, using digital control circuitry. See for example, U.S. Pat. No. 4,825,102, issued to Toshiyuki Iwasawa et al. for MOS FET DRIVE CIRCUIT PROVIDING PROTECTION AGAINST TRANSIENT VOLTAGE BREAKDOWN. Alternately, the circuitry may be implemented using inverters with different switching voltage thresholds. See for example, U.S. Pat. No. 4,827,159, issued to Masayuki Naganuma for HIGH POWER BUFFER CIRCUIT WITH LOW NOISE.

In addition, the severity of voltage variations in the power voltage and source voltage due to transitions on an output can be lessened by using feedback to control the current available to charge up the gates of transistors used in the voltage driver of the output stage. See for example, U.S. Pat. No. 4,825,099, issued to Steven K. Barton for FEEDBACK-CONTROLLED CURRENT OUTPUT DRIVER HAVING REDUCED CURRENT SURGE.

The severity of voltage variations in the power voltage and source voltage due to transitions on an output may also be lessened by using control devices to reduce the initial load charge up but increasing the load charge up thereafter. See for example, U.S. Pat. No. 4,800,298 issued to Ruey J. Yu et al for OUTPUT BUFFER FOR IMPROVING DI/DT. Similarly, control circuitry or a source follower may be added to the output buffer stage so that rather than a single large current surge at a transition, many smaller current surges occur at different times. See for example, U.S. Pat. No. 4,829,199 issued to James S. Prater for DRIVER CIRCUIT PROVIDING LOAD AND TIME ADAPTIVE CURRENT or U.S. Pat. No. 4,825,101 issued to Donald M. Walters Jr. for FULL-LEVEL, FAST CMOS OUTPUT BUFFER.

SUMMARY OF THE INVENTION

In accordance with the preferred embodiment of the present invention, a circuit for buffering output in an integrated circuit is presented. The circuit includes a circuit input, a circuit output, a power signal, a ground signal, a first transistor, a second transistor, a third transistor, a fourth transistor, variable resistance means, and control means. The first transistor has a source, a gate and a drain. The drain is connected to the power signal. The gate is connected to the circuit input.

The second transistor has a source, a gate and a drain. The source of the second transistor is connected to the ground signal and the gate of the second transistor is connected to the circuit input. The third transistor has a source, a gate and a drain. The drain of the third transistor is connected to the power signal. The source of the third transistor is connected to the circuit output and the gate of the third transistor is connected to the source of the first transistor. The fourth transistor also has a source, a gate and a drain. The source of the fourth transistor is connected to the ground signal. The drain of the fourth transistor is connected to the circuit output. The gate of the fourth transistor is connected to the drain of the second transistor.

The variable resistance means is connected between the source of the first transistor and the drain of the second transistor. The variable resistance provides one of a first impedance and a second impedance between the source of the first transistor and drain of the second transistor in response to a control signal. The variable resistance means additionally includes a control input means for receiving the control input.

The control means is connected to the control input means of the variable resistance means. The control means places the control signal on the control input means. After a voltage level transition on the circuit input and during a resulting voltage level transition on the circuit output, in response to the control signal placed on the control input means by the control means, the variable resistance means first provides the first impedance and then provides the second impedance between the source of the first transistor and drain of the second transistor.

In the preferred embodiment, the variable resistance includes a first variable resistor, for example a first FET, and a second variable resistor, for example a second FET, connected in parallel between the source of the first transistor and the drain of the second transistor. Also, the control input means includes a first control input to the first variable resistor, and a second control input to the second variable resistor. Likewise, the control signal includes a first control signal placed on the first control input by the control means, and a second control signal placed on the second control input by the control means.

The control means may be implemented in a number of ways. For example, the control means may include a logical NOT gate, a logical NAND gate and a logical NOR gate. In a first preferred embodiment an input of the logical NOT gate is connected to the circuit output. A first input of the logical NAND gate is connected to the ground signal. A second input of the logical NAND gate is connected to the output of the logical NOT gate. An output of the logical NAND gate is connected to the first control input to the first FET. A first input of the logical NOR gate is connected to the power signal. A second input of the logical NOR gate is connected to the output of the logical NOT gate. An output of the logical NOR gate is connected to the second control input to the second FET.

In a second preferred embodiment an input of the logical NOT gate is connected to the circuit output. A first input of the logical NAND gate is connected to the power signal. A second input of the logical NAND gate is connected to the output of the logical NOT gate. An output of the logical NAND gate is connected to the first control input to the first FET. A first input of the logical NOR gate is connected to the round signal. A second input of the logical NOR gate is connected to the output of the logical NOT gate. An output of the logical NOR gate is connected to the second control input to the second FET. In both the first and second embodiments, the gate of the first transistor is an inverted gate, the gate of the second transistor is an inverted gate and the second control input to the second FET is an inverted input.

The circuit is advantageous in that at the start of a voltage transition period, only a small current flows to or from the circuit output. After the initial transition period, a larger current is allowed to surge. This removes the large change in the rate of current flow at the beginning of a transition, thus effectively limiting voltage spikes on the power line and ground line.

DESCRIPTION OF THE PREFERRED EMBODIMENT

Figure 1:
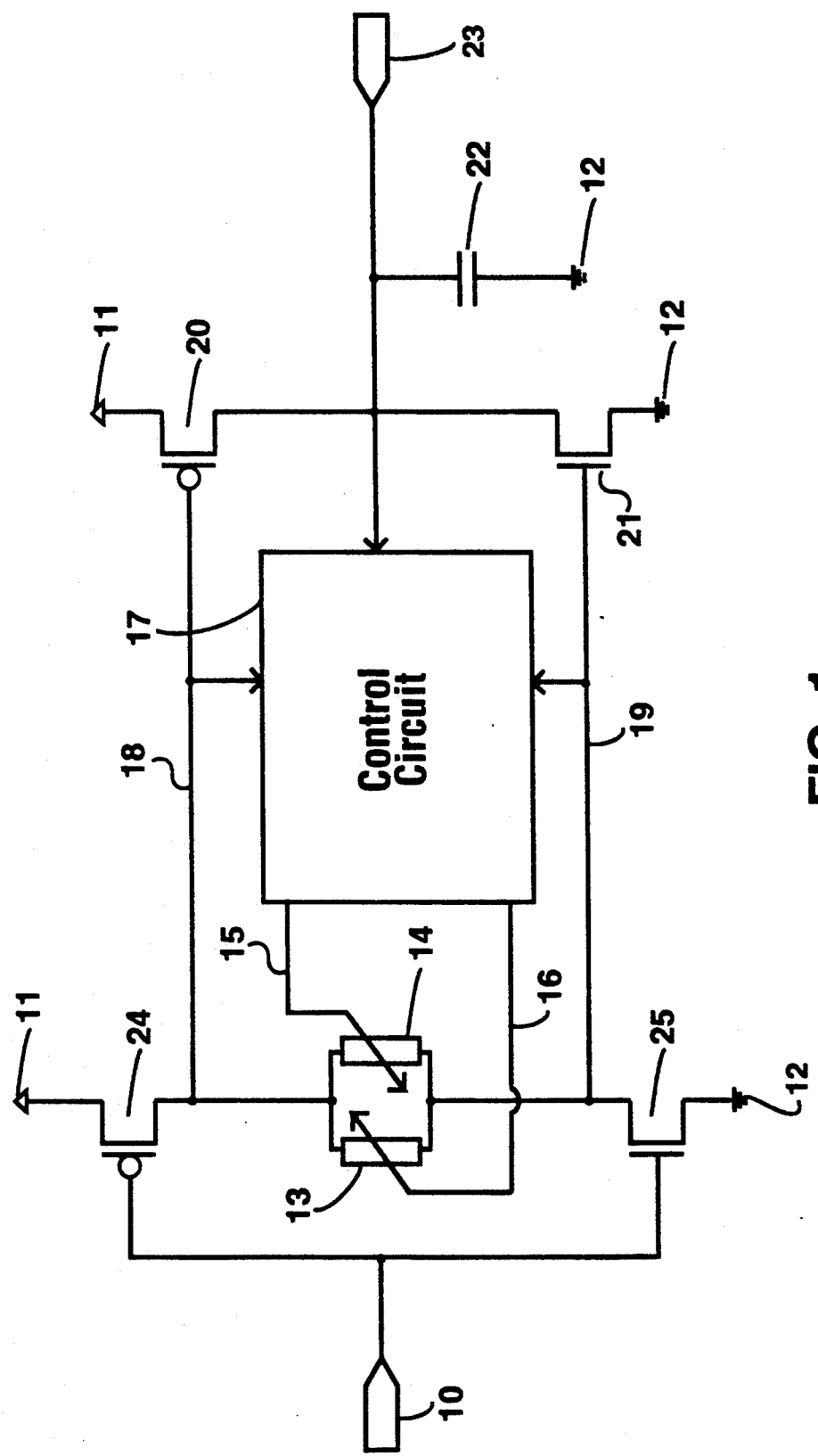
FIG. 1 shows a block diagram of an output buffer circuit in accordance with the preferred embodiment of the present invention.

FIG. 1 shows a block diagram of an output buffer circuit. An output signal from a core circuit is placed on an input 10 of the output buffer circuit. The output buffer circuit buffers the output signal and forwards the output signal to a buffered output 23. A capacitance 22 represents a capacitive load for buffered output 23. Buffered output 23 is pulled high by a power signal 11 when a transistor 20 is turned on. Buffered output 23 is pulled low by a ground signal 12 when a transistor 21 is turned on.

The switching of transistor 20 and transistor 21 is controlled by a transistor 24 and a transistor 25. A variable resistance 13 and a variable resistance 14 are connected in parallel between transistor 24 and transistor 25. Variable resistance 13 is controlled by a control output 16 from a control circuit 17. Variable resistance 14 is controlled by a control output 15 from control circuit 17. Control circuit 17 generates control signals for control output 15 and control output 16 based on voltage values on buffered output 23, a circuit node 18 and a circuit node 19.

Control circuit 17 controls variable resistance 13 and variable resistance 14 so that the amount of charge sourced by power signal 11 or the amount of charge sunk by ground signal 12 is limited at the very beginning of a transition. After this initial period of the transition, a greater amount of charge may be sourced or sunk. In this way the circuit of the present invention is able to limit the large change in current flow which causes the voltage spikes in the power signal and the ground signal.

When output is static, one of variable resistance 13 and variable resistance 14 has a relatively large impedance and the other has a relatively low impedance. After the initial period of a transition, both variable resistance 13 and variable resistance 14 will have a relatively low impedance. Once the transition is complete, again one of variable resistance 13 and variable resistance 14 will have a relatively large impedance and the other will have a relatively low impedance.

For example, when the output buffer circuit is static and input 10 is low, variable resistance 13 has a relatively low impedance and variable resistance 14 has a relatively large impedance. During a transition when input 10 transitions from low to high, a "crowbar" current flows between transistor 24 and transistor 25 through the parallel arrangement of variable resistance 13 and variable resistance 14. The current through the parallel arrangement of variable resistance 13 and variable resistance 14 results in a voltage drop between circuit node 18 and circuit node 19. Circuit node 19 is quickly pulled low. Because of the voltage drop across the parallel arrangement of variable resistance 13 and variable resistance 14, circuit node 18 is pulled low slower. Once circuit node 19 is low, and after an additional time delay, control circuit 17 through control output 15 causes impedance across variable resistance 14 to drop. When impedance across variable resistance 14 is lowered, this allows the voltage at circuit node 18 to be lowered quicker. The result is an initial small current surge at buffered output 23, followed by a larger current surge. After a time control circuit 17, through control output 16, causes variable resistance 13 to have a relatively high impedance.

Similarly, when the output buffer circuit is static and input 10 is high, variable resistance 13 has a relatively high impedance and variable resistance 14 has a relatively low impedance. During a transition when input 10 transitions from high to low, a "crowbar" current flows between transistor 24 and transistor 25 through the parallel arrangement of variable resistance 13 and variable resistance 14. The current through the parallel arrangement of variable resistance 13 and variable resistance 14 results in a voltage drop between circuit node 18 and circuit node 19. Circuit node 18 is quickly pulled high. Because of the voltage drop across the parallel arrangement of variable resistance 13 and variable resistance 14, circuit node 19 is pulled high slower. Once circuit node 18 is high, and after an additional time delay, control circuit 17 through control output 16 causes impedance across variable resistance 13 to drop. When impedance across variable resistance 13 is lowered, this allows the voltage at circuit node 19 to be raised quicker. The result is an initial small current surge at buffered output 23, followed by a larger current surge. After a time, control circuit 17, through control output 15, causes variable resistance 14 to have a relatively high impedance.

Figure 2:
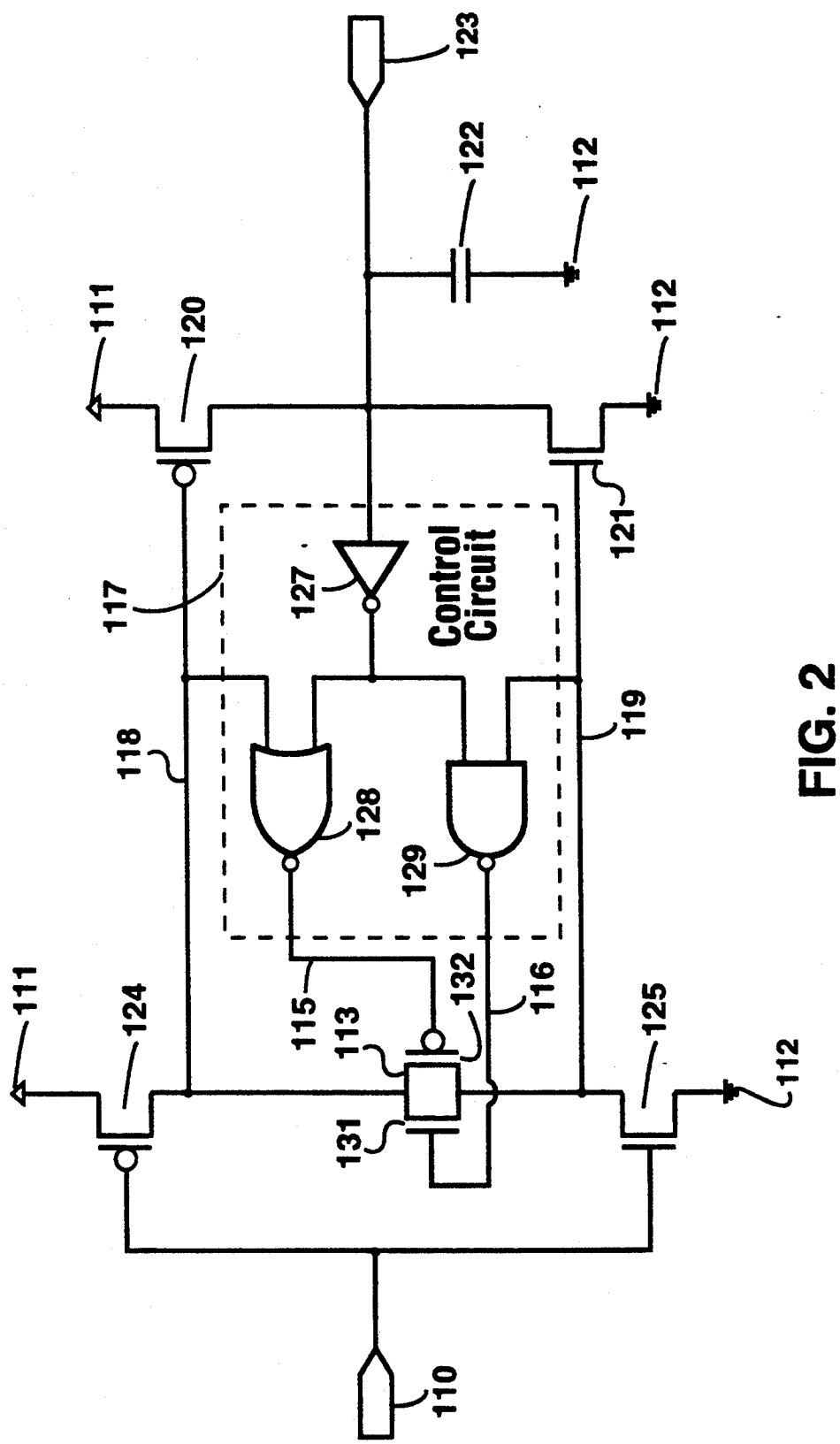
FIG. 2 shows a preferred embodiment of control logic for the output buffer circuit shown in FIG. 1, in accordance with the present invention.

FIG. 2 shows a schematic implementation of the circuit shown in FIG. 1. An output signal from a core circuit is placed on an input 110 of the output buffer circuit. The output buffer circuit buffers the output signal and forwards the output signal to a buffered output 123. A capacitance 122 represents a capacitive load for buffered output 123. Buffered output 123 is pulled high by a power signal 111 when a transistor 120 is turned on. Buffered output 123 is pulled low by a ground signal 112 when a transistor 121 is turned on.

The switching of transistor 120 and transistor 121 is controlled by a transistor 124 and a transistor 125. A variable resistance 113 is connected between transistor 124 and transistor 125. Variable resistance 113 is controlled by a control output 116 and a control output 115. Control output 115 and control output 116 are generated by a control circuit 117 which consists of a logical NOT gate 127, a logical NOR gate 128 and a logical NAND gate 129 connected as shown. Variable resistance 113 includes two field effect transistors (FET)s connected in parallel. A FET 132 is turned on when control output 115 is low. A FET 131 is turned on when control output 116 is high. Control circuit 117 generates control signals for control output 115 and control output 116 based on voltage values on buffered output 123, a circuit node 118 and a circuit node 119.

Control circuit 117 controls FET 131 and FET 132 so that the amount of charge sourced by power signal 111 or the amount of charge sunk by ground signal 112 is limited at the very beginning of a transition. After this initial period of the transition, a greater amount of charge may be sourced or sunk. In this way the circuit of the present invention is able to limit the large change in current which causes the voltage spikes in the power signal and the ground signal. A typical value for capacitive load 122 is 50–200 picofarads. A typical impedance for FET 131 is $10^{12}$ ohms when off and 10 to 50 ohms when on. A typical impedance for FET 132 is $10^{12}$ ohms when off and 80 to 200 ohms when on.

Figure 3:
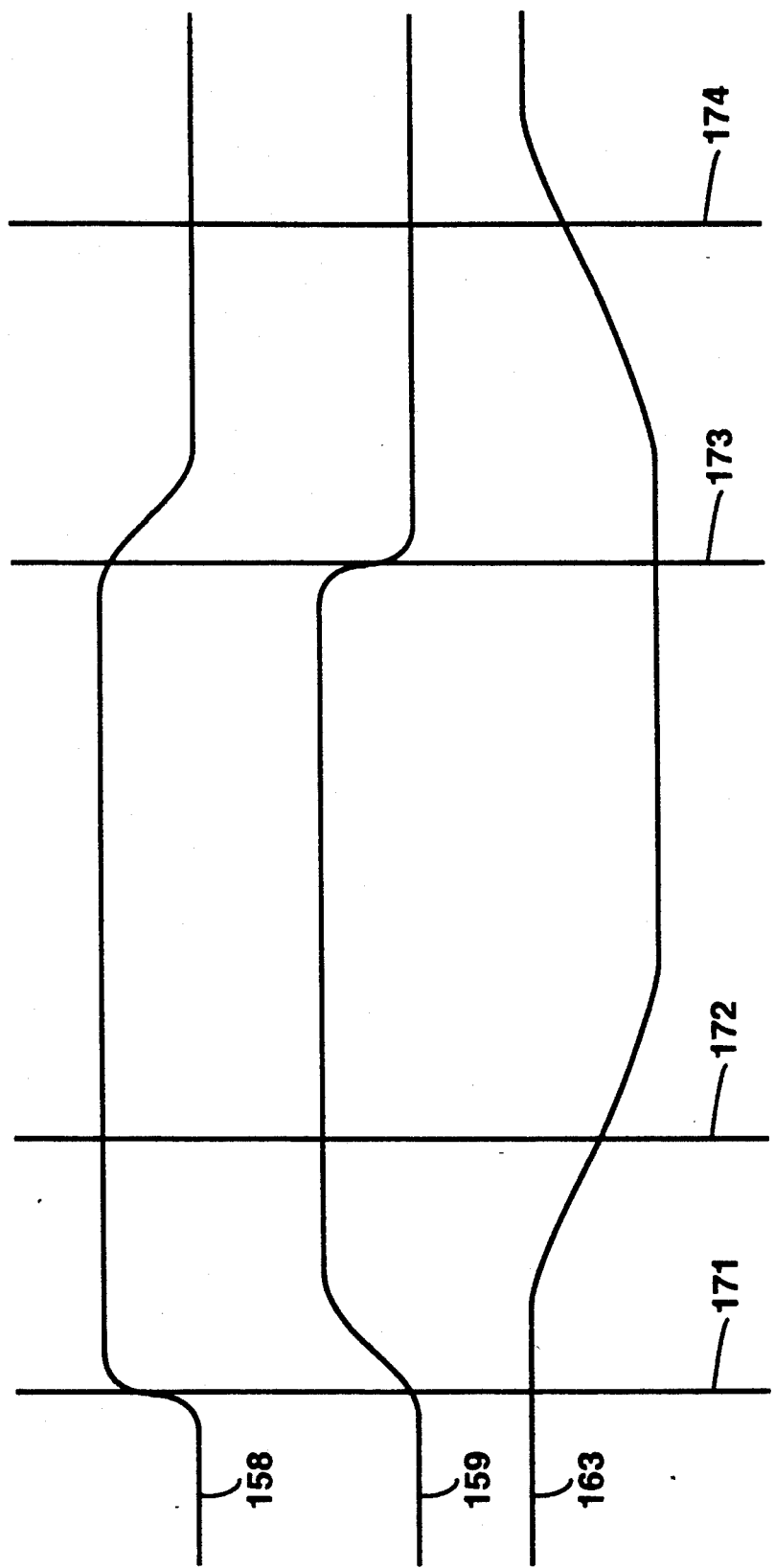
FIG. 3 shows a timing diagram for signals from location on the circuit shown in FIG. 2 in accordance with the preferred embodiment of the present invention.

FIG. 3 shows a timing diagram for the circuit shown in FIG. 2. A signal wave 158 represents voltage on circuit node 118, a signal wave 159 represents voltage on circuit node 119 and a signal wave 163 represents voltage on buffered output 123.

Initially, the output buffer circuit is static and input 110 is high. FET 131 is on and has a relatively low impedance. FET 132 is off and has a relatively high impedance. When input 110 transitions from high to low, circuit node 118 rapidly transitions from low to high as shown by signal wave 158. Because of the voltage drop across the parallel arrangement of FET 131 and FET 132, circuit node 119 is pulled high slower, as shown by signal wave 159. Control circuit 117 switches FET 132 on at a time 171 shown in FIG. 3. When impedance across FET 132 is lowered, this allows the voltage at circuit node 119 to be raised quicker. The result is an initial small current surge at buffered output 123, followed by a larger current surge. At a time 172, control circuit 117, through control output 116, switches FET 131 off. As shown by signal wave 163, buffered output 123 continues to stabilize at low.

When the output buffer circuit stabilizes, FET 132 is on and has a relatively low impedance. FET 131 is off and has a relatively high impedance. When input 110 transitions from low to high, circuit node 119 is quickly pulled low, as shown by signal waveform 159. Because of the voltage drop across the parallel arrangement of FET 131 and FET 132, circuit node 118 is pulled low slower. Control circuit 117 switches FET 131 on at a time 173 shown in FIG. 3. When impedance across FET 131 is lowered, this allows the voltage at circuit node 118 to be lowered quicker. The result is an initial small current surge at buffered output 123, followed by a larger current surge. At a time 174, control 117, through control output 115, switches FET 132 off. As shown by signal wave 163, buffered output 123 continues to stabilize high.

Figure 4:
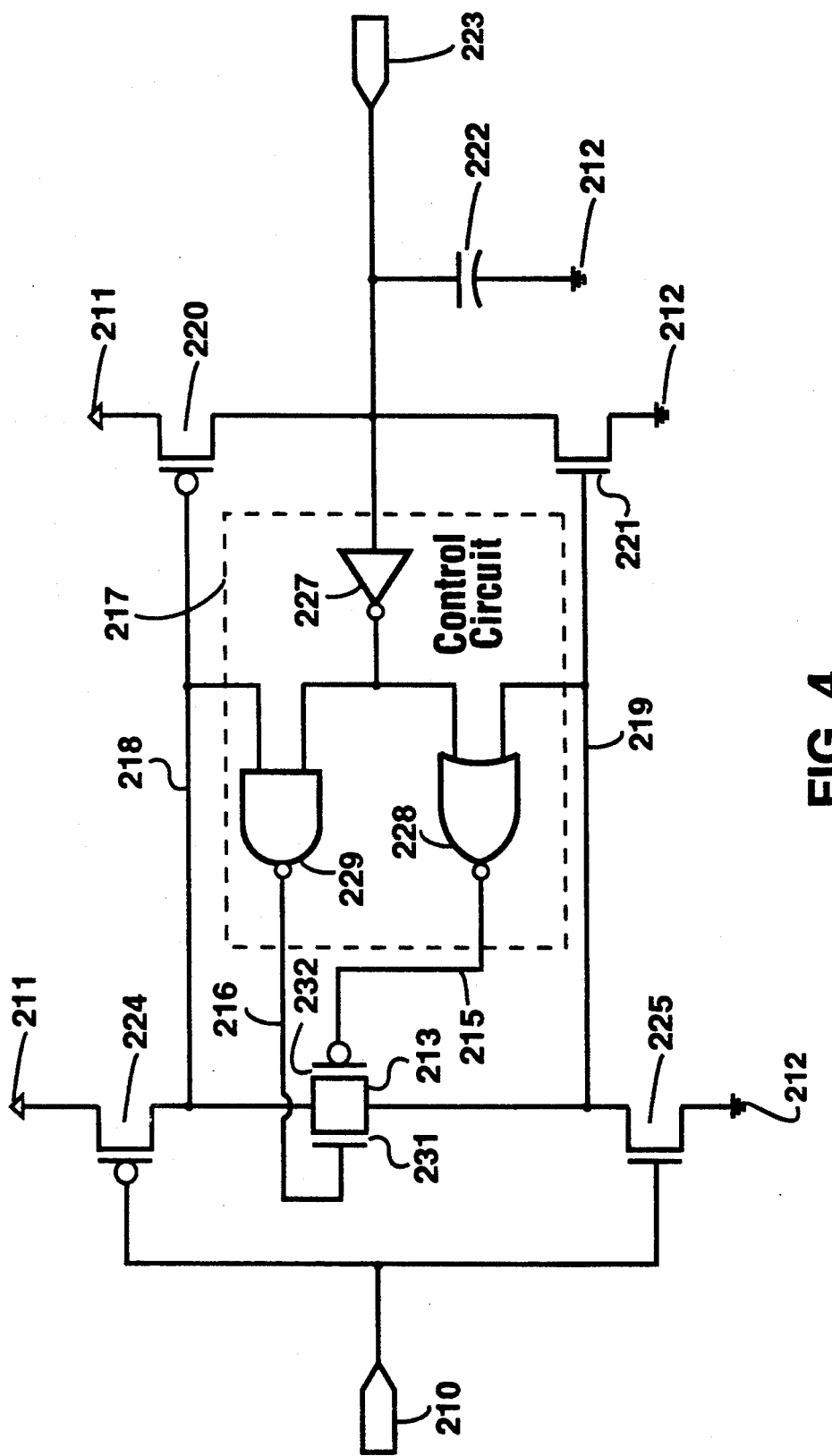
FIG. 4 shows an alternate preferred embodiment of control logic for the output buffer circuit shown in FIG. 1, in accordance with the present invention.

FIG. 4 shows an alternate schematic implementation of the circuit shown in FIG. 1. An output signal from a core circuit is placed on an input 210 of the output buffer circuit. The output buffer circuit buffers the output signal and forwards the output signal to a buffered output 223. A capacitance 222 represents a capacitive load for buffered output 223. Buffered output 223 is pulled high by a power signal 211 when a transistor 220 is turned on. Buffered output 223 is pulled low by a ground signal 212 when a transistor 221 is turned on.

The switching of transistor 220 and transistor 221 is controlled by a transistor 224 and a transistor 225. A variable resistance 213 is connected between transistor 224 and transistor 225. Variable resistance 213 is controlled by a control output 216 and a control output 215. Control output 215 and control output 216 are generated by a control circuit 217 which consists of a logical NOT gate 227, a logical NOR gate 228 and a logical NAND gate 229 connected as shown. Variable resistance 213 includes two field effect transistors (FET)s connected in parallel. A FET 232 is turned on when control output 215 is low. A FET 231 is turned on when control output 216 is high. Control circuit 217 generates control signals for control output 215 and control output 216 based on voltage values on buffered output 223, a circuit node 218 and a circuit node 219.

Control circuit 217 controls FET 231 and FET 232 so that the amount of charge sourced by power signal 211 or the amount of charge sunk by ground signal 212 is limited at the very beginning of a transition. After this initial period of the transition, a greater amount of charge may be sourced or sunk. In this way the circuit of the present invention is able to limit the large change in current flow which causes the voltage spikes in the power signal and the ground signal. A typical value range for capacitive load 222 is 50 to 200 picofarads. A typical impedance for FET 231 is $10^{12}$ ohms when off and 10 to 50 ohms when on. A typical impedance for FET 232 is $10^{12}$ ohms when off and 80 to 200 ohms when on.

Figure 5:
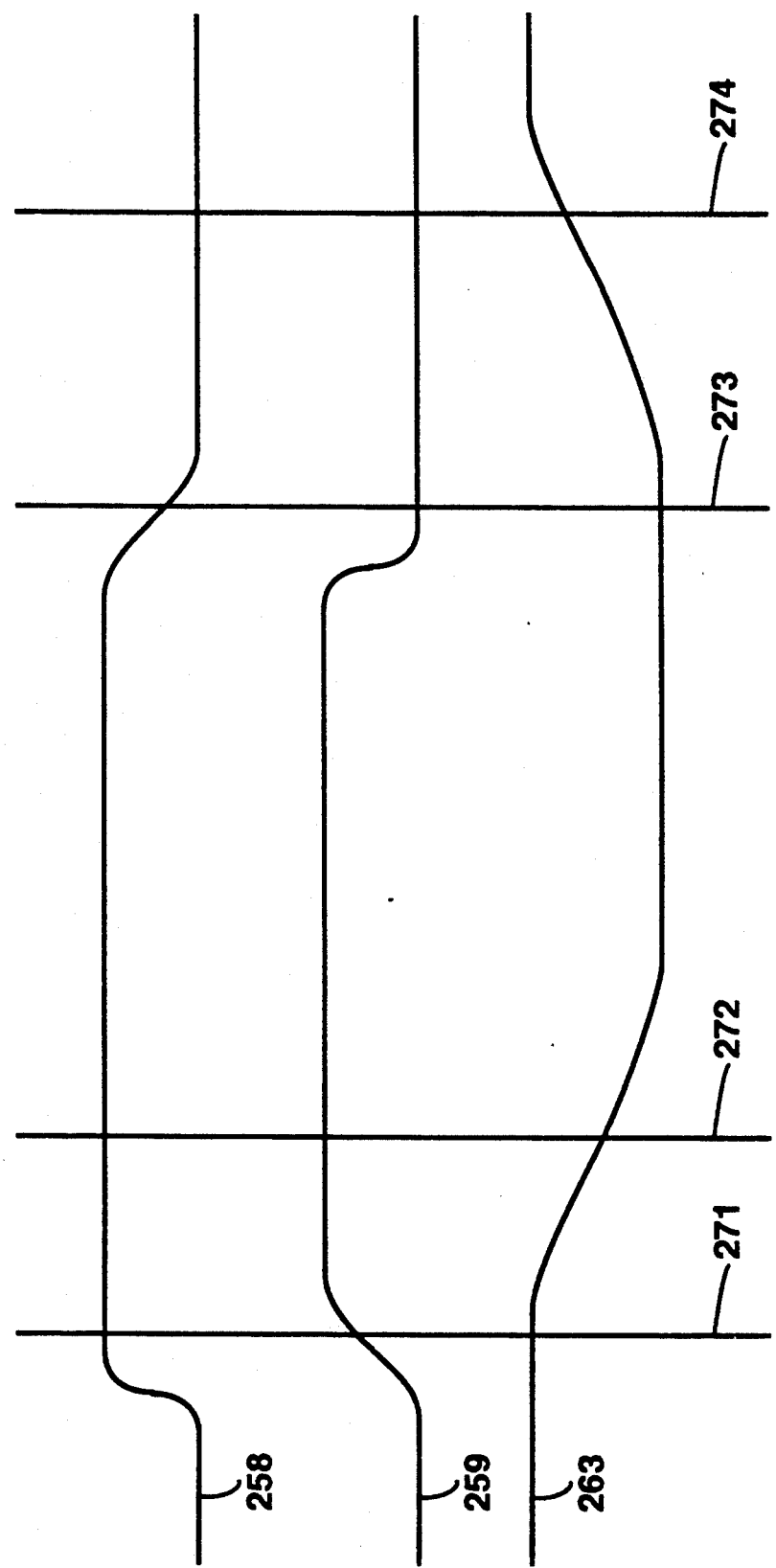
FIG. 5 shows a timing diagram for signals from locations on the circuit shown in FIG. 4 in accordance with the alternate preferred embodiment of the present invention

FIG. 5 shows a timing diagram for the circuit shown in FIG. 4. A signal wave 258 represents voltage on circuit node 218, a signal wave 259 represents voltage on circuit node 219 and a signal wave 263 represents voltage on buffered output 223.

Initially, the output buffer circuit is static and input 210 is high. FET 231 is on and has a relatively low impedance. FET 232 is off and has a relatively high impedance. When input 210 transitions from high to low, circuit node 218 rapidly transitions from low to high as shown by signal wave 258. Because of the voltage drop across the parallel arrangement of FET 231 and FET 232, circuit node 219 is pulled high slower, as shown by signal wave 259. Control circuit 217 switches FET 232 on at a time 271 shown in FIG. 5. When impedance across FET 232 is lowered, this allows the voltage at circuit node 219 to be raised quicker. The result is an initial small current surge at buffered output 223, followed by a larger current surge. At a time 272, control circuit 217, through control output 216, switches FET 231 off. As shown by signal wave 263, buffered output 223 continues to stabilize at low.

When the output buffer circuit stabilizes, FET 232 is on and has a relatively low impedance. FET 231 is off and has a relatively high impedance. When input 210 transitions from low to high, circuit node 219 is quickly pulled low, as shown by signal waveform 259. Because of the voltage drop across the parallel arrangement of FET 231 and FET 232, circuit node 218 is pulled low slower. Control circuit 217 switches FET 231 on at a time 273 shown in FIG. 5. When impedance across FET 231 is lowered, this allows the voltage at circuit node 218 to be lowered quicker. The result is an initial small current surge at buffered output 223, followed by a larger current surge. At a time 274, control 217, through control output 215, switches FET 232 off. As shown by signal wave 263, buffered output 223 continues to stabilize high.

As may be seen from a comparison of FIG. 3 and FIG. 5, during a transition FET 131 or FET 132 are turned on closer to the beginning of the transition than are FET 231 and FET 232. This is due to the relative differences in the arrangement in logic within control circuit 117 and within control circuit 217.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A circuit for buffering output in an integrated circuit, the circuit comprising:
   a circuit input;
   a circuit output;
   a power signal;
   a ground signal;
   a first transistor having a source, a gate and a drain, the drain being coupled to the power signal and the gate being coupled to the circuit input;
   a second transistor having a source, a gate and a drain, the source of the second transistor being coupled to the ground signal and the gate of the second transistor being coupled to the circuit input;
   a third transistor having a source, a gate and a drain, the drain of the third transistor being coupled to the power signal, the source of the third transistor being coupled to the circuit output and the gate of the third transistor being coupled to the source of the first transistor;
   a fourth transistor having a source, a gate and a drain, the source of the fourth transistor being coupled to the ground signal, the drain of the fourth transistor being coupled to the circuit output and the gate of the fourth transistor being coupled to the drain of the second transistor;
   variable resistance means, coupled between the source of the first transistor and the drain of the second transistor, for providing one of a first impedance and a second impedance between the source of the first transistor and drain of the second transistor in response to a control signal, the variable resistance means including a control input means for receiving the control signal; and,
   control means, coupled to the control input means of the variable resistance means, for placing the control signal on the control input means;
   wherein, after a voltage level transition on the circuit input and during a resulting voltage level transition on the circuit output, in response to the control signal placed on the control input means by the control means, the variable resistance means first provides the first impedance and then provides the second impedance between the source of the first transistor and drain of the second transistor.

2. A circuit as in claim 1 wherein the first transistor is p-channel transistor and the second transistor is an n-channel transistor.

3. A circuit as in claim 1 wherein:
   the variable resistance means includes a first variable resistor and a second variable resistor coupled in parallel between the source of the first transistor and the drain of the second transistor;
   the control input means includes
     a first control input of the first variable resistor, and
     a second control input of the second variable resistor; and,
   the control signal includes
     a first control signal placed on the first control input by the control means, and
     a second control signal placed on the second control input by the control means.

4. A circuit as in claim 1 wherein:
   the variable resistance means includes a first FET and a second FET coupled in parallel between the source of the first transistor and the drain of the second transistor;
   the control input means includes
     a first control input of the first FET, and
     a second control input of the second FET; and,
   the control signal includes
     a first control signal placed on the first control input by the control means, and
     a second control signal placed on the second control input by the control means.

5. A circuit as in claim 4 wherein the control means comprises:

a logical NOT gate having an input and an output, the input of the logical NOT gate being coupled to the circuit output;

a logical NAND gate having a first input, a second input and an output, the first input of the logical NAND gate being coupled to the drain of the second transistor, the second input of the logical NAND gate being coupled to the output of the logical NOT gate and the output of the logical NAND gate being coupled to the first control input of the first FET; and a logical NOR gate having a first input, a second input and an output, the first input of the logical NOR gate being coupled to the source of the first transistor, the second input of the logical NOR gate being coupled to the output of the logical NOT gate and the output of the logical NOR gate being coupled to the second control input of the second FET.

6. A circuit as in claim 5 wherein the first transistor is a p-channel transistor, the second transistor is an n-channel transistor and the second control input of the second FET is an inverted input.

7. A circuit as in claim 4 wherein the control means comprises:

a logical NOT gate having an input and an output, the input of the logical NOT gate being coupled to the circuit output;

a logical NAND gate having a first input, a second input and an output, the first input of the logical NAND gate being coupled to the source of the first transistor, the second input of the logical NAND gate being coupled to the output of the logical NOT gate and the output of the logical NAND gate being coupled to the first control input of the first FET; and, a logical NOR gate having a first input, a second input and an output, the first input of the logical NOR gate being coupled to the drain of the second transistor, the second input of the logical NOR gate being coupled to the output of the logical NOT gate and the output of the logical NOR gate being coupled to the second control input of the second FET.

8. A circuit as in claim 7 wherein the first transistor is a p-channel transistor, the second transistor is an n-channel transistor and the second control input of the second FET is an inverted input.

9. A circuit for buffering output in an integrated circuit, the circuit comprising:

a circuit input;
a circuit output;
a power signal;
a ground signal;
a first transistor having a source, a gate and a drain, the drain being coupled to the power signal and the gate being coupled to the circuit input;
a second transistor having a source, a gate and a drain, the source of the second transistor being coupled to the ground signal and the gate of the second transistor being coupled to the circuit input;
a third transistor having a source, a gate and a drain, the drain of the third transistor being coupled to the power signal, the source of the third transistor being coupled to the circuit output and the gate of the third transistor being coupled to the source of the first transistor;

a fourth transistor having a source, a gate and a drain, the source of the fourth transistor being coupled to the ground signal, the drain of the fourth transistor being coupled to the circuit output and the gate of the fourth transistor being coupled to the drain of the second transistor;

a first variable resistor coupled between the source of the first transistor and the drain of the second transistor, the first variable resistor having a first control input and the first variable resistor providing one of the first impedance and a second impedance in response to a first control signal placed on the first control input;

a second variable resistor coupled between the source of the first transistor and the drain of the second transistor, the second variable resistor having a second control input and the second variable resistor providing one of a first impedance and a second impedance in response to a second control signal placed on the second control input;

control means, coupled to the first control input of the first variable resistor and to the second control input of the second variable resistor, for placing the first control signal on the first control input and for placing the second control signal on the second control input;

wherein, after a voltage level transition on the circuit input and during a resulting voltage level transition on the circuit output, in response to the first control signal placed on the first control input by the control means and in response to the second control signal placed on the second control input by the control means, one of the first variable resistor and the second variable resistor provides the first impedance while the other provides the second impedance, then both the first variable resistor and the second variable resistor each provide the first impedance.

10. A circuit as in claim 9 wherein the first transistor is a p-channel transistor and the second transistor is an n-channel transistor.

11. A circuit as in claim 9 wherein:
the first variable resistor is a first FET and the second variable resistor is a second FET.

12. A circuit as in claim 10 wherein the control means comprises:

a logical NOT gate having an input and an output, the input of the logical NOT gate being coupled to the circuit output;

a logical NAND gate having a first input, a second input and an output, the first input of the logical NAND gate being coupled to the drain of the second transistor, the second input of the logical NAND gate being coupled to the output of the logical NOT gate and the output of the logical NAND gate being coupled to the first control input of the first FET; and, a logical NOR gate having a first input, a second input and an output, the first input of the logical NOR gate being coupled to the source of the first transistor, the second input of the logical NOR gate being coupled to the output of the logical NOT gate and the output of the logical NOR gate being coupled to the second control input of the second FET.

13. A circuit as in claim 12 wherein the first transistor is a p-channel transistor, the second transistor is an n-channel transistor and the second control input of the second FET is an inverted input.

14. A circuit as in claim 10 wherein the control means comprises:
- a logical NOT gate having an input and an output, the input of the logical NOT gate being coupled to the circuit output;
- a logical NAND gate having a first input, a second input and an output, the first input of the logical NAND gate being coupled to the source of the first transistor, the second input of the logical NAND gate being coupled to the output of the logical NOT gate and the output of the logical NAND gate being coupled to the first control input of the first FET; and,
- a logical NOR gate having a first input, a second input and an output, the first input of the logical NOR gate being coupled to the drain of the second transistor, the second input of the logical NOR gate being coupled to the output of the logical NOT gate and the output of the logical NOR gate being coupled to the second control input of the second FET.

15. A circuit as in claim 14 wherein the first transistor is a p-channel transistor, the second transistor is an n-channel transistor and the second control input of the second FET is an inverted input.

* * * * *